(12) United States Patent
Toprac

(10) Patent No.: US 6,549,822 B1
(45) Date of Patent: Apr. 15, 2003

(54) METHOD AND APPARATUS FOR CONTROL OF MULTI-CUP SEMICONDUCTOR MANUFACTURING TRACKS

(75) Inventor: Anthony J. Toprac, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 328 days.

(21) Appl. No.: 09/625,432

(22) Filed: Jul. 25, 2000

(51) Int. Cl.[7] .................... G06F 19/00; H01L 21/00
(52) U.S. Cl. ...................... 700/121; 700/108; 438/5
(58) Field of Search .................... 700/45, 71, 108, 700/121; 438/5, 7, 8

(56) References Cited

U.S. PATENT DOCUMENTS

| | | | | |
|---|---|---|---|---|
| 5,939,130 A | * | 8/1999 | Shiraishi et al. | 118/52 |
| 6,051,349 A | * | 4/2000 | Yoshioka et al. | 118/111 |
| 6,113,694 A | * | 9/2000 | Davis | 118/319 |
| 6,248,175 B1 | * | 6/2001 | Subramanian et al. | 118/300 |
| 6,263,255 B1 | * | 7/2001 | Tan et al. | 700/106 |
| 6,317,642 B1 | * | 11/2001 | You et al. | 427/240 |
| 6,335,286 B1 | * | 1/2002 | Lansford | 156/345.13 |
| 6,368,879 B1 | * | 4/2002 | Toprac | 438/5 |
| 6,405,096 B1 | * | 6/2002 | Toprac et al. | 438/14 |

* cited by examiner

*Primary Examiner*—Leo Picard
*Assistant Examiner*—Elliot Frank
(74) *Attorney, Agent, or Firm*—Williams, Morgan & Amerson, P.C.

(57) ABSTRACT

The present invention provides for a method and an apparatus for controlling multiple semiconductor wafer cups. At least one process run of semiconductor devices is processed. A multi-wafer-cup process analysis is performed upon the processed semiconductor devices. At least one control parameter is modified for a subsequent process run of semiconductor devices using results from the multi-wafer-cup process analysis.

28 Claims, 6 Drawing Sheets

METHOD AND APPARATUS FOR CONTROL OF MULTI-CUP SEMICONDUCTOR MANUFACTURING TRACKS

BACKGROUND OF THE INVENTION

1. Field of the Invention

This invention relates generally to semiconductor products, and, more particularly, to a method and apparatus for simultaneously controlling multi-cup semiconductor manufacturing tracks.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semi-conductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the important aspects in semiconductor device manufacturing are RTA control, chemical-mechanical polishing (CMP) control, etching, and overlay control. Overlay is one of several important steps in the photolithography area of semiconductor manufacturing. Overlay process involves measuring the misalignment between two successive patterned layers on the surface of a semiconductor device. Generally, minimization of misalignment errors is important to ensure that the multiple layers of the semiconductor devices are connected and functional.

Generally, process engineers currently analyze the process errors a few times a month. The results from the analysis of the process errors are used to make updates to process tool settings manually. Generally, a manufacturing model is employed to control the manufacturing processes. Some of the problems associated with the current methods include the fact that the process tool settings are only updated a few times a month. Furthermore, currently the process tool updates are generally performed manually. Many times, errors in semiconductor manufacturing are not organized and reported to quality control personal. Often, the manufacturing models themselves incur bias errors that could compromise manufacturing quality.

Generally, a set of processing steps is performed on a lot of wafers on a semiconductor manufacturing tool called an exposure tool or a stepper, followed by processing of the semiconductor wafers in etch tools. The manufacturing tool communicates with a manufacturing framework or a network of processing modules. The manufacturing tool is generally connected to an equipment interface. The equipment interface to which the stepper is connected is also connected to a machine interface, thereby facilitating communications between the stepper and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices. Many times, errors can occur during the processing of semiconductor devices. Furthermore, semiconductor wafers that are processed in different sections, such as different wafer cups on a manufacturing track, of a manufacturing area often have different characteristics. Often, crucial characteristics, such as critical dimensions, of a semiconductor wafer can be non-uniform due to variations between the different sections of a manufacturing area. The lack of uniformity can cause quality and efficiency problems. In some cases, multiple semiconductor wafer cups are not utilized in a single process to avoid semiconductor wafers that have non-uniform characteristics, resulting in inefficient use of manufacturing resources.

The present invention is directed to overcoming, or at least reducing the effects of, one or more of the problems set forth above.

SUMMARY OF THE INVENTION

In one aspect of the present invention, a method is provided for controlling multiple semiconductor wafer cups in photolithography processing tools. At least one process run of semiconductor devices is processed. A multi-wafer-cup process analysis is performed upon the processed semiconductor devices. At least one control parameter is modified for a subsequent process run of semiconductor devices using results from the multi-wafer-cup process analysis.

In another aspect of the present invention, an apparatus is provided for controlling multiple semiconductor wafer cups. The apparatus of the present invention comprises: a computer system; a manufacturing model coupled with the computer system, the manufacturing model being capable of generating at least one control parameter input signal; a machine interface coupled with the manufacturing model, the machine interface being capable of receiving process recipes from the manufacturing model; a processing tool capable of processing semiconductor wafers and coupled with the machine interface, the processing tool being capable of receiving at least one control input parameter signal from the machine interface; a first wafer cup coupled with the processing tool for receiving semiconductor wafers, wherein the first wafer cup is capable of applying a photoresist material onto a semiconductor wafer; a second wafer cup coupled with the processing tool for receiving semiconductor wafers, wherein the second wafer cup is capable of applying a photoresist material onto a semiconductor wafer; a metrology tool coupled with the processing tool, the metrology tool being capable of acquiring metrology data; and a metrology data processing unit coupled with the metrology tool and the computer system, the metrology data processing unit being capable of organizing the acquired metrology data and sending the organized metrology data to the computer system.

BRIEF DESCRIPTION OF THE DRAWINGS

The invention may be understood by reference to the following description taken in conjunction with the accompanying drawings, in which like reference numerals identify like elements, and in which.

Figure 1:
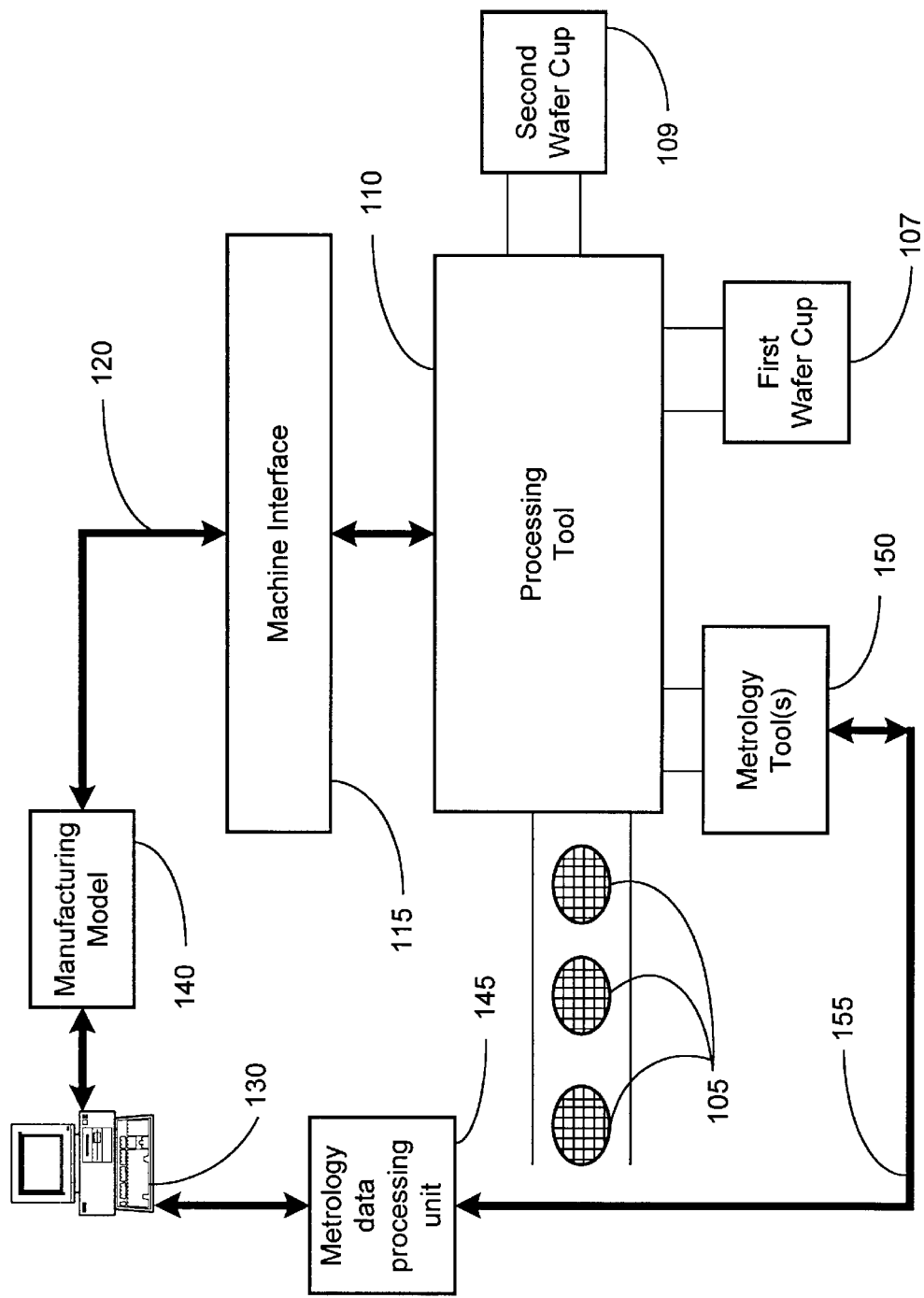
FIG. 1 illustrates one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. As semiconductor devices are processed through manufacturing tools, production data, or manufacturing data, is generated. The production data can be used to perform fault detection analysis that can lead to improved manufacturing results. Photolithography and etching processes are important groups of process steps in semiconductor manufacturing. In particular, metrology data, including manufacturing data, is acquired after manufacturing processes such as photolithography and photoresist etching processes are substantially completed. The metrology data can be used to make adjustments to manufacturing processes for subsequent manufacturing runs of semiconductor devices, such as semiconductor wafers. Semiconductor wafers that are processed on multiple semiconductor wafer cups tend to produce semiconductor wafers that have non-uniform characteristics. Even when multiple semiconductor wafer cups are controlled by the same recipe, variations in the semiconductor wafer cups can cause non-uniform semiconductor wafers. The present invention provides a method and apparatus for controlling multiple semiconductor wafer cups on a manufacturing track and reducing the aforementioned non-uniform characteristics in the processed semiconductor wafers.

Turning now to FIG. 1, one embodiment of the present invention is illustrated. In one embodiment, semiconductor products 105, such as semiconductor wafers are processed on processing tool 110 using a plurality of control input signals on a line 120. In one embodiment, the control input signals on the line 120 are sent to the processing tool 110 from a computer system 130 via machine interface 115. In one embodiment, the machine interface 115 is located outside the processing tool 110. In an alternative embodiment, the machine interface 115 is located within the processing tool 110.

In one embodiment, the computer system 130 sends control input signals on a line 120 to the machine interface 115. The computer system 130 employs a manufacturing model 140 to generate the control input signals on the line 120. In one embodiment, the manufacturing model contains a recipe that determines a plurality of control input parameters that are sent on the line 120.

In one embodiment, the manufacturing model 140 defines a process script and input control that implement a particular manufacturing process. The control input signals on a line 120 that are intended for processing tool 110 are received and processed by the machine interface 115. Examples of the processing tool 110 used in semiconductor manufacturing processes are steppers, tracks, scanners, step-and-scan tools, and etch process tools. In one embodiment, processing tool 110 is a photolithography process tool, such as a stepper.

The system illustrated in FIG. 1 includes a first wafer cup 107 and a second wafer cup 109 that are part of a manufacturing track (not shown). In one embodiment, the first wafer cup 107 and the second wafer cup 109 are coupled with the processing tool 110. In one embodiment, the wafer cups 107, 109 are capable of spinning semiconductor wafers such that photoresist material is centrifugally distributed across the base of the semiconductor wafers. The present invention teaches a method of tracing the performance of multiple wafer cups 107, 109 and performing corrections in the manufacturing processes to compensate for variations between the multiple wafer cups 107, 109.

For processing tools such as steppers, the control inputs, on the line 120, that are used to operate the processing tool 110 include a variety of recipe settings, such as cup spin ramp-up rates, cup spin speed, amount of photoresist dosed onto the wafer, and photoresist application nozzle position. For processing tools such as etch process tools, the control inputs on the line 120 include an etch time-period control signal, an etch temperature control signal, and an etch pressure control signal.

For photolithography processes, when a process step in a processing tool 110 is concluded, the semiconductor product 105 or wafer that is being processed is examined in a metrology tool. One such metrology tool is a KLA 4100 CD SEM (Scanning Electron Microscope). One set of data derived from the operation of the metrology tool is a quantitative measure of the linewidth of the patterned photoresist caused by the previous photolithography tool process. In one embodiment, the amount of deviation from the required linewidth relates to the photoresist spin process in the photolithography tool. In one embodiment, the mount of linewidth, or critical dimension (CD), error that occurred can be attributed to the control inputs for a particular photoresist cup. The control inputs generally affect the accuracy of the process steps performed by the processing tool 110 on the semiconductor wafer. Modifications of the control inputs can be utilized to improve the performance of the process steps employed in the manufacturing tool. Many times, the errors that are found in the processed semiconductor products 105 can be correlated to a particular fault analysis and corrective actions can be taken to reduce the errors.

Figure 2:
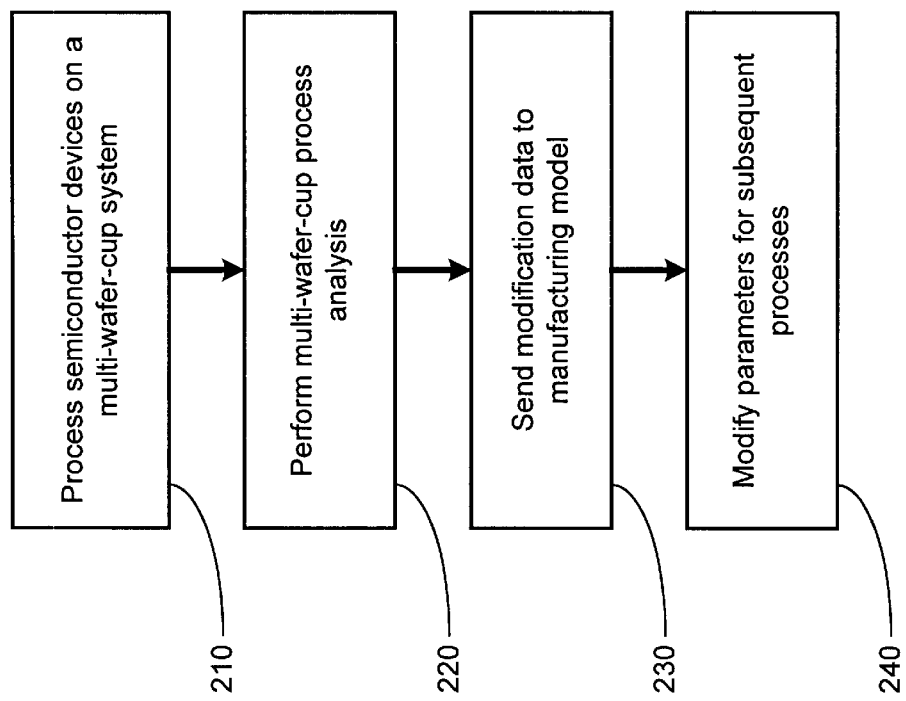
FIG. 2 illustrates a flowchart representation of one method of controlling and utilizing multiple semiconductor wafer cups in a semiconductor manufacturing area, as taught the present invention.
Figure 3:
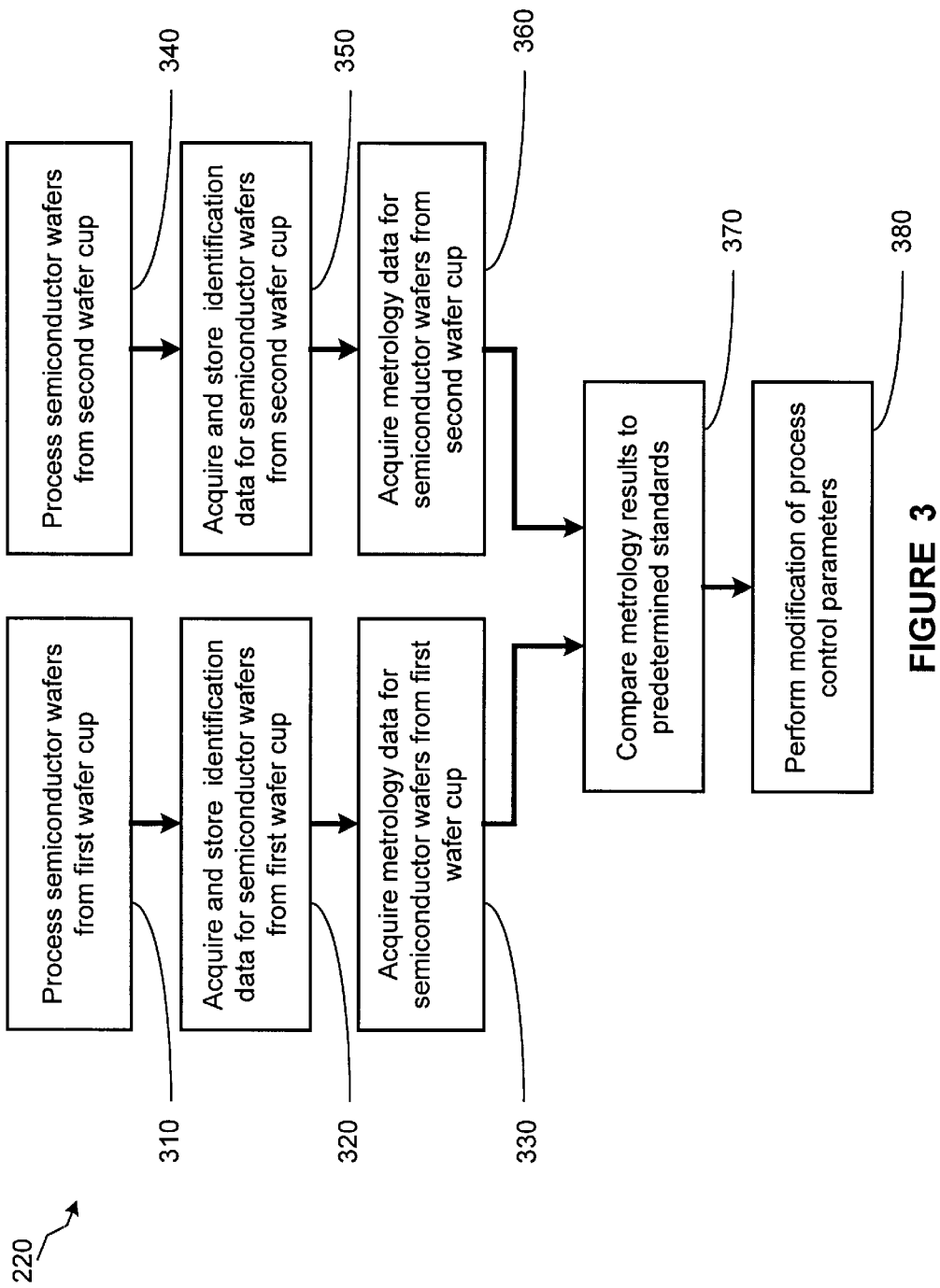
FIG. 3 illustrates a more detailed depiction of a first embodiment of a step of performing multi-track process analysis described in FIG. 2.

Turning now to FIG. 2, a flow chart representation of one method of controlling and utilizing multiple semiconductor wafer cups in a semiconductor manufacturing area is illustrated. In one embodiment, a set of semiconductor devices, such as semiconductor wafers, are processed in a multi-wafer-cup manufacturing system, as described in block 210 of FIG. 2. Once semiconductor wafers are at least partially processed in a multi-wafer-cup manufacturing system, a multi-wafer-cup process analysis is performed, as described in block 220 of FIG. 2. FIG. 3 illustrates a first embodiment of a more detailed embodiment of the step of performing multi-wafer-cup analysis.

Turning now to FIG. 3, semiconductor wafers in the first wafer cup 107 are processed, as described in block 310 of FIG. 3. In one embodiment, the first wafer cup 107 spins at least one semiconductor wafer while photoresist material is added onto the base of the semiconductor wafer. The centrifugal force generated by the spinning motion causes the photoresist material to be uniformly distributed on the surface of the semiconductor wafer. Furthermore, the centrifugal force from the spinning action can be used to remove excess photoresist material from the surface of the semiconductor wafer. When semiconductor wafers in the first wafer cup 107 are processed, wafer identification data relating to the semiconductor wafers is acquired, stored, and correlated with the first wafer cup 107, as described in block 320 of FIG. 3. The wafer identification data that is acquired includes semiconductor wafer set number, date coding, manufacturing coding, and the like. In one embodiment, the wafer identification data is stored in the computer system 130.

Metrology data associated with the processed semiconductor wafers from the first wafer cup 107 is acquired, as described in block 330 of FIG. 3. In one embodiment, the metrology data is acquired using one or more metrology tools 150. Processed semiconductor wafers from the first wafer cup 107 are sent to the metrology tool 150. Metrology data from the metrology tool 150 is sent to the metrology data processing unit 145 on a line 155. The metrology data processing unit 145 correlates the metrology data to the wafer identification data for further analysis. In one embodiment, the metrology data processing unit 145 is integrated into the computer system 130, which in one embodiment is integrated into the APC framework. The metrology data processing unit 145 is capable of organizing metrology data from the semiconductor wafers and correlating the metrology data with the corresponding wafer identification data.

In one embodiment, while semiconductor wafers are being processed using the first wafer cup 107, semiconductor wafers from the second wafer cup 109 are also processed, as described in block 340 of FIG. 3. In one embodiment, the second wafer cup 109 spins at least one semiconductor wafer while photoresist material is added onto the base of the semiconductor wafer. The centrifugal force generated by the spinning motion causes the photoresist material to be uniformly distributed on the surface of the semiconductor wafer. Furthermore, the centrifugal force from the spinning action can be used to remove excess photoresist material from the surface of the semiconductor wafer. When semiconductor wafers in the second wafer cup 109 are processed, wafer identification data relating to the semiconductor wafers is acquired, stored, and correlated with the second wafer cup 109, as described in block 350 of FIG. 3. The wafer identification data that is acquired includes semiconductor wafer set number, date coding, manufacturing coding, and the like. In one embodiment, the wafer identification data is stored in the computer system 130.

Metrology data associated with the processed semiconductor wafers from the second wafer cup 109 is acquired, as described in block 360 of FIG. 3. In one embodiment, the metrology data is acquired using one or more metrology tools 150. Processed semiconductor wafers from the second wafer cup 109 are sent to the metrology tool 150. Metrology data from the metrology tool 150 is sent to the metrology data processing unit 145 on a line 155. The metrology data processing unit 145 correlates the metrology data to the wafer identification data for further analysis. In one embodiment, the metrology data processing unit 145 is integrated into the computer system 130, which in one embodiment, is integrated into the APC framework. The metrology data processing unit 145 is capable of organizing metrology data from the semiconductor wafers and correlating the metrology data with the corresponding wafer identification data.

Once semiconductor wafers in the first wafer cup 107 and the second wafer cup 109 are processed, metrology data relating to the processed semiconductor wafers are compared to a predetermined set of standards, as described in block 370 of FIG. 3. The predetermined set of standards includes predetermined data relating to critical dimensions, misregistration error tolerances, and the like. The results from the comparison analysis described in block 370 is utilized to perform correction of process control parameters for subsequent processes of semiconductor wafers in the first and second wafer cups 107, 109, as described in block 380 of FIG. 3. One embodiment of performing correction of control parameters described in block 380 is described in further detail in FIG. 4.

Figure 4:
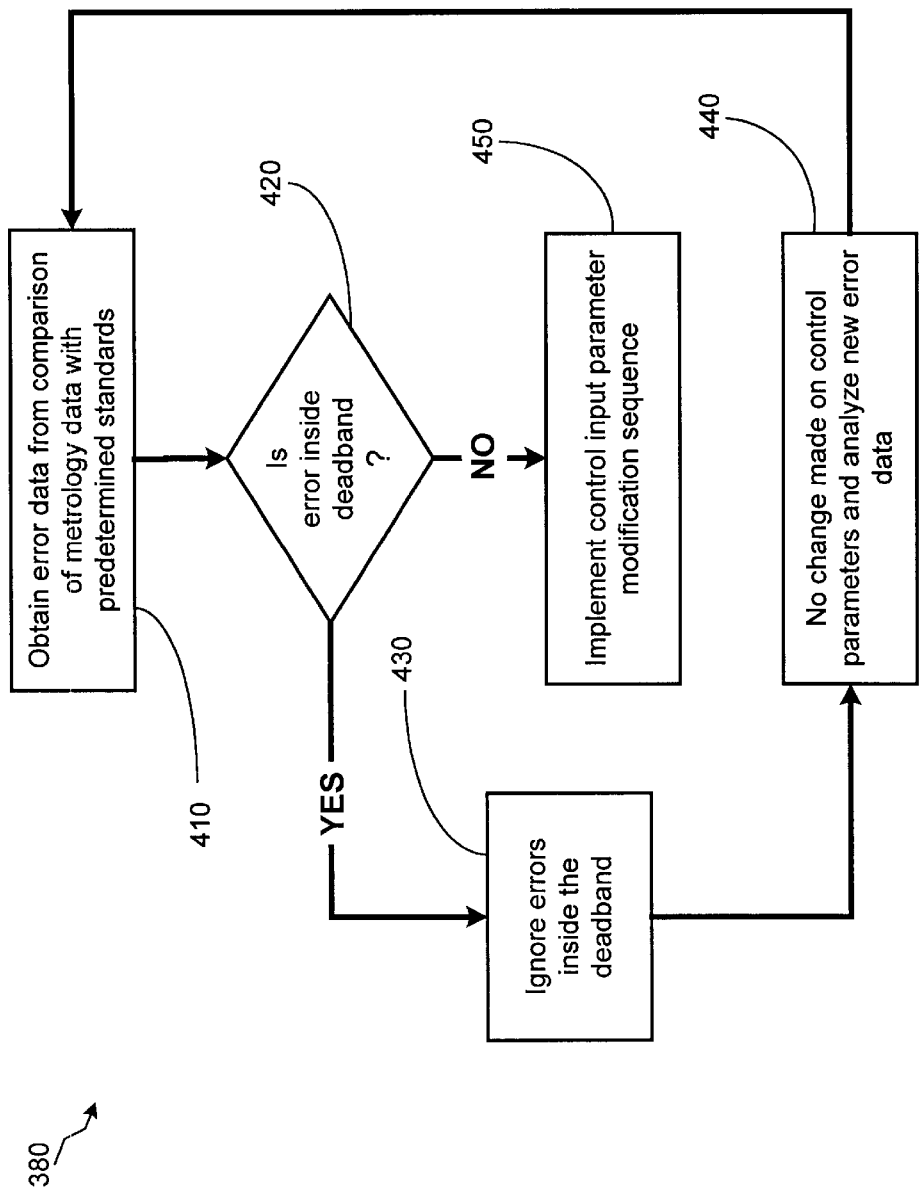
FIG. 4 illustrates a flowchart representation of a more detailed depiction of a step of performing modification of control input parameters described in FIG. 3.

Turning now to FIG. 4, error data from the comparison of metrology data related to processed semiconductor wafers from the first and second wafer cups 107, 109 to predetermined standards is acquired, as described in block 410. Once the error data is acquired, a determination is made whether the error data is inside the deadband, as described in block 420 of FIG. 4. The step described in block 420 is performed to determine whether an error is sufficiently significant to warrant a change in the control inputs on the line 120. To define the deadband, the errors acquired from product analysis stations (not shown), such as the review station, are compared to a predetermined set of threshold parameters. In one embodiment, the deadband contains a range of error values associated with control input signals centered proximate to a set of corresponding predetermined target values, for which generally controller action is blocked. If any one of the errors acquired from the product analysis station is smaller than its corresponding predetermined threshold value, that particular error is deemed to be in the deadband. One of the primary purposes of the deadband is to prevent excessive control actions, resulting from changes to control input signals on the line 120, from causing a semiconductor manufacturing process to be inordinately jittery.

When a determination is made, as shown in block 420, that an error corresponding to a control input signal is inside the deadband, that particular error is ignored, as described in block 430 of FIG. 4. Therefore, when the value of an error that corresponds to a control input signal is found to be in the predetermined deadband, that particular error is not used to update its corresponding control input signal. In one embodiment, when the error data is determined to be inside the deadband, no changes to the control parameters are made based upon that particular error data, as described in block 440 of FIG. 4. New error data is then obtained and analyzed, as described in block 440 of FIG. 4. In one embodiment, the steps described above are repeated for the new error data that is obtained.

When a determination is made, as shown in block 420, that an error corresponding to a control input signal is outside the deadband, further processing, such as implementing a control input parameter modification sequence, is performed, as described in block 450 of FIG. 4. The value of the error corresponding to a control input signal is used to update that control input parameter on the line 120 for a subsequent manufacturing process step, which completes the step of performing correction of process control parameters, described in block 380 of FIG. 3. Upon completion of the step described in block 380 of FIG. 3, the step of performing multi-wafer-cup process analysis described in block 220 of FIG. 2 is substantially complete.

Figure 5:
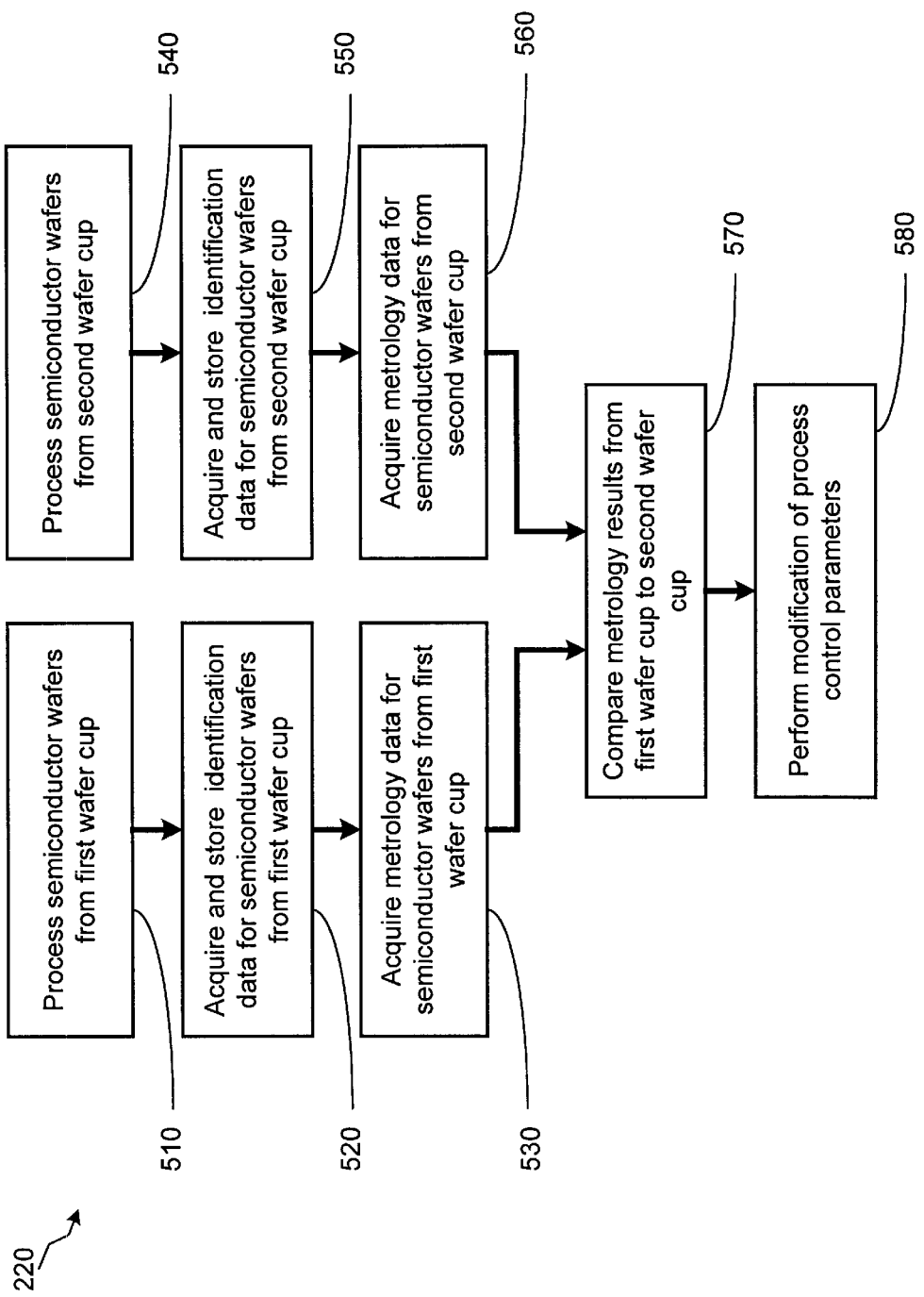
FIG. 5 illustrates a more detailed depiction of a second embodiment of the step of performing multi-track process analysis described in FIG. 2.

FIG. 5 illustrates a second embodiment of a more detailed embodiment of the step of performing multi-wafer-cup analysis. Turning now to FIG. 5, semiconductor wafers in the first wafer cup 107 are processed, as described in block 510 of FIG. 5. In one embodiment, the first wafer cup 107 spins at least one semiconductor wafer while photoresist material is added onto the base of the semiconductor wafer. The centrifugal force generated by the spinning motion causes the photoresist material to be uniformly distributed on the surface of the semiconductor wafer. Furthermore, the centrifugal force from the spinning action can be used to remove excess photoresist material from the surface of the semiconductor wafer. When semiconductor wafers in the first wafer cup 107 are processed, wafer identification data relating to the semiconductor wafers is acquired, stored, and correlated with the first wafer cup 107, as described in block 520 of FIG. 5. The wafer identification data that is acquired includes semiconductor wafer set number, date coding, manufacturing coding, and the like. In one embodiment, the wafer identification data is stored in the computer system 130.

Metrology data associated with the processed semiconductor wafers from the first wafer cup 107 is acquired, as described in block 530 of FIG. 5. In one embodiment, the metrology data is acquired using one or more metrology tools 150. Processed semiconductor wafers from the first wafer cup 107 are sent to the metrology tool 150. Metrology data from the metrology tool 150 is sent to the metrology data processing unit 145 on a line 155. The metrology data processing unit 145 correlates the metrology data to the wafer identification data for further analysis. In one embodiment, the metrology data processing unit 145 is integrated into the computer system 130, which in one embodiment, is integrated into the APC framework. The metrology data processing unit 145 is capable of organizing metrology data from the semiconductor wafers and correlating the metrology data with the corresponding wafer identification data.

In one embodiment, while semiconductor wafers are being processed using the first wafer cup 107, semiconductor wafers from the second wafer cup 109 are also processed, as described in block 540 of FIG. 5. In one embodiment, the second wafer cup 109 spins at least one semiconductor wafer while photoresist material is added onto the base of the semiconductor wafer. The centrifugal force generated by the spinning motion causes the photoresist material to be uniformly distributed on the surface of the semiconductor wafer. Furthermore, the centrifugal force from the spinning action can be used to remove excess photoresist material from the surface of the semiconductor wafer. When semiconductor wafers in the second wafer cup 109 are processed, wafer identification data relating to the semiconductor wafers is acquired, stored, and correlated with the second wafer cup 109, as described in block 550 of FIG. 5. The wafer identification data that is acquired includes semiconductor wafer set number, date coding, manufacturing coding, and the like. In one embodiment, the wafer identification data is stored in the computer system 130.

Metrology data associated with the processed semiconductor wafers from the second wafer cup 109 is acquired, as described in block 560 of FIG. 5. In one embodiment, the metrology data is acquired using one or more metrology tools 150. Processed semiconductor wafers from the second wafer cup 109 are sent to the metrology tool 150. Metrology data from the metrology tool 150 is sent to the metrology data processing unit 145 on a line 155. The metrology data processing unit. 145 correlates the metrology data to the wafer identification data for further analysis. In one embodiment, the metrology data processing unit 145 is integrated into the computer system 130, which, in one embodiment, is integrated into the APC framework. The metrology data processing unit 145 is capable of organizing metrology data from the semiconductor wafers and correlating the metrology data with the corresponding wafer identification data.

Once semiconductor wafers in the first wafer cup 107 and the second wafer cup 109 are processed, metrology data relating to the processed semiconductor wafers from the first wafer cup 107 is compared to the metrology data relating to the processed semiconductor wafers from the second wafer cup 109, as described in block 570 of FIG. 5. The metrology data that is compared includes data relating to critical dimensions, misregistration error tolerances, and the like. The results from the comparison analysis described in block 570 are utilized to perform correction of process control parameters for subsequent processes of semiconductor wafers in the first and second wafer cups 107, 109, as described in block 580 of FIG. 3. One embodiment of performing correction of control parameters described in block 580 is described in further detail in FIG. 6.

Figure 6:
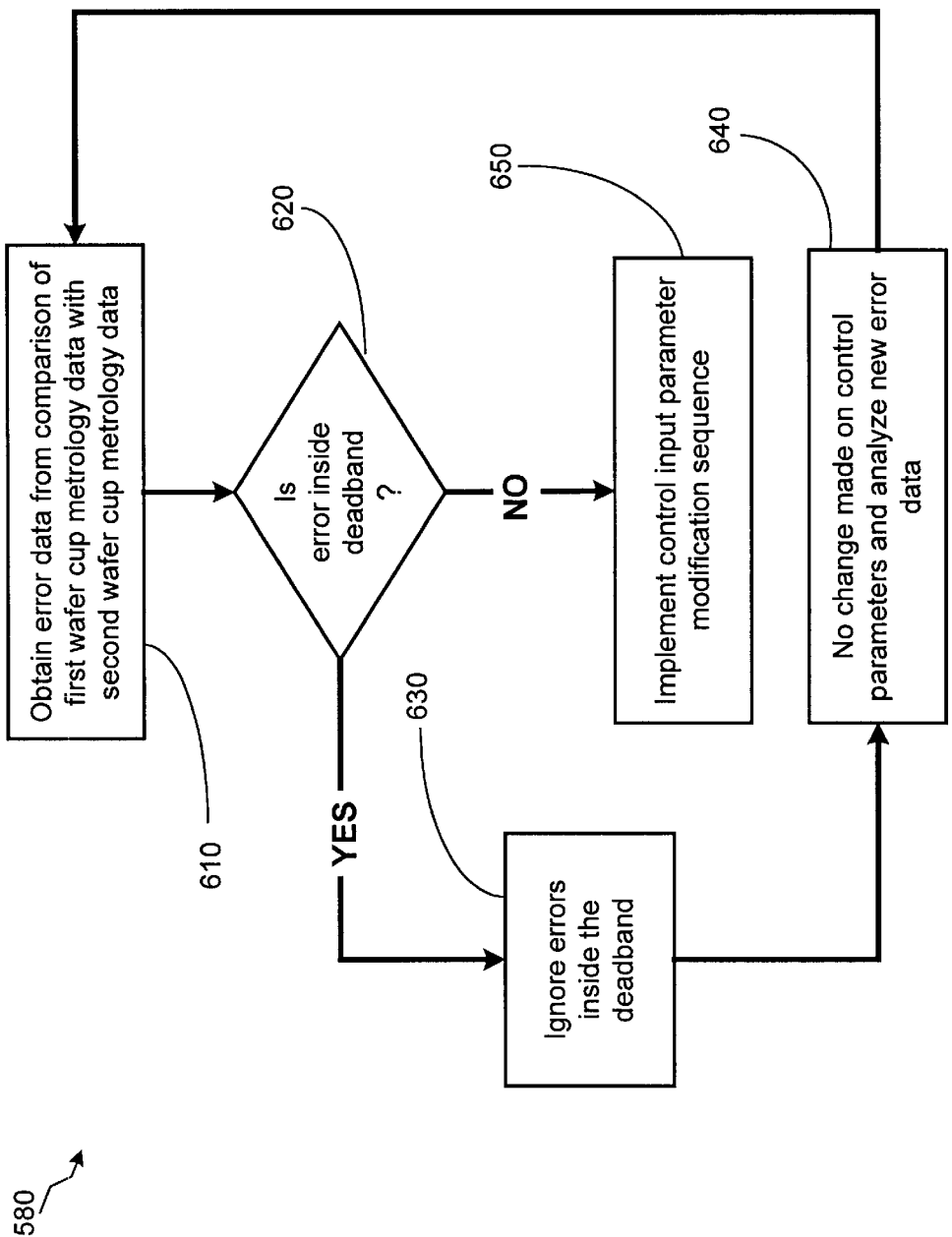
FIG. 6 illustrates a flowchart representation of a more detailed depiction of the step of performing modification of control input parameters described in FIG. 5.

Turning now to FIG. 6, error data from the comparison of metrology data related to processed semiconductor wafers from the first wafer cups 107 to metrology data related to processed semiconductor wafers from the second wafer cups 109 is acquired, as described in block 610. Once the error data is acquired, a determination is made whether the error data is inside the deadband, as described in block 620 of FIG. 6. The step described in block 620 is performed to determine whether an error is sufficiently significant to warrant a change in the control inputs on the line 120. To define the deadband, the errors acquired from product analysis stations (not shown), such as the review station, are compared to a predetermined set of threshold parameters. In one embodiment, the deadband contains a range of error values associated with control input signals centered proximate to a set of corresponding predetermined target values, for which generally controller action is blocked. If any one of the errors acquired from the product analysis station is smaller than its corresponding predetermined threshold value, that particular error is deemed to be in the deadband. One of the primary purposes of the deadband is to prevent excessive control actions, resulting from changes to control input signals on the line 120, from causing a semiconductor manufacturing process to be inordinately jittery.

When a determination is made, as shown in block 620, that an error corresponding to a control input signal is inside the deadband, that particular error is ignored, as described in block 630 of FIG. 6. Therefore, when the value of an error that corresponds to a control input signal is found to be in the predetermined deadband, that particular error is not used to update its corresponding control input signal. In one embodiment, when the error data is determined to be inside the deadband, no changes to the control parameters are made based upon that particular error data, as described in block 640 of FIG. 6. New error data is then obtained and analyzed, as described in block 640 of FIG. 6. In one embodiment, the steps described above are repeated for the new error data that is obtained.

When a determination is made, as shown in block 620, that an error corresponding to a control input signal is outside the deadband, further processing, such as implementing a control input parameter modification sequence, is performed, as described in block 650 of FIG. 6. The value of the error corresponding to a control input signal is used to update that control input parameter on the line 120 for a subsequent manufacturing process step, which completes the step of performing correction of process control parameters, described in block 580 of FIG. 5. Upon completion of the step described in block 580 of FIG. 5, the step of performing multi-wafer-cup process analysis described in block 220 of FIG. 2 is substantially complete.

Turning back to FIG. 2, once the multi-wafer-cup process analysis is performed and the amount of modifications to be made to the control input parameters is determined, the modification data is sent to the manufacturing model, as described in block 230. The manufacturing model then modifies control input parameters on the line 120, as described in block 240 of FIG. 2. The modified control input signals are used by the machine interface 115 to modify the process performance in the processing tool 110 and the wafer cups 107, 109 (FIG. 1). In one embodiment, the control input parameters are modified on a run-to-run basis.

Utilizing the steps described in FIGS. 2–6, semiconductor wafers that are processed in the first wafer cup 107 are substantially uniform to the semiconductor wafers that are processed in the second wafer cup 109. The uniformity gained by using the methods taught by the present invention allows for simultaneous operation of multiple wafer cups 107, 109, thereby increasing the quality and efficiency of production of semiconductor devices. The method taught by the present invention can be utilized in other types of manufacturing.

The principles taught by the present invention can be implemented in an Advanced Process Control (APC) Framework. The APC is a preferred platform from which to implement the overlay control and etch process control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller and etch process controller. The control methods are generally defined and performed in these scripts. The development of these scripts can comprise a significant portion of the development of a control system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

performing at least one process run of semiconductor devices;

performing a multi-wafer-cup process analysis upon the processed semiconductor devices, said multi-wafer-cup process analysis comprising correlating identification data relating to said semiconductor devices from a plurality of cups, with metrology data relating to semiconductor devices from said plurality of cups; and modifying at least one control parameter for a subsequent process run of semiconductor devices using results from said multi-wafer-cup process analysis.

2. The method described in claim 1, wherein performing a process run of semiconductor devices further comprises processing semiconductor wafers.

3. The method described in claim 2, wherein processing semiconductor wafers further comprises performing a photolithography process on said semiconductor wafers.

4. The method described in claim 1, wherein performing a multi-wafer-cup process analysis upon the processed semiconductor devices further comprises:

processing semiconductor wafers in a first wafer cup;

acquiring identification data associated with said semiconductor wafers in said first wafer cup;

acquiring metrology data associated with said processed semiconductor wafers in said first wafer cup;

correlating said acquired metrology data relating to said semiconductor wafers in said first wafer cup with said identification data;

processing semiconductor wafers in a second wafer cup;

acquiring identification data associated with said semiconductor wafers in said second wafer cup;

acquiring metrology data associated with said processed semiconductor wafers in said second wafer cup;

correlating said acquired metrology data relating to said semiconductor wafers in said second wafer cup with said identification data;

comparing said correlated metrology results of semiconductor wafers from said first wafer cup and said second wafer cup to a predetermined standard; and performing modification of control parameters in response to the comparison of said metrology results.

5. The method described in claim 4, wherein comparing said correlated metrology results of semiconductor wafers from said first wafer cup and said second wafer cup to a predetermined standard further comprises comparing said correlated metrology data to a predetermined critical dimension value.

6. The method described in claim 4, wherein performing modification of control parameters further comprises:
acquiring error data from said comparison of metrology data to said predetermined standards;
determining if said error data is inside a deadband; and
modifying at least one control input parameter based upon a determination that said error data is not inside said deadband.

7. The method described in claim 1, wherein performing a multi-wafer-cup process analysis upon the processed semiconductor devices further comprises:
processing semiconductor wafers in a first wafer cup;
acquiring identification data associated with said semiconductor wafers in said first wafer cup;
acquiring metrology data associated with said processed semiconductor wafers in said first wafer cup;
correlating said acquired metrology data relating to said semiconductor wafers in said first wafer cup with said identification data;
processing semiconductor wafers in a second wafer cup;
acquiring identification data associated with said semiconductor wafers in said second wafer cup;
acquiring metrology data associated with said processed semiconductor wafers in said second wafer cup;
correlating said acquired metrology data relating to said semiconductor wafers in said second wafer cup with said identification data;
comparing said correlated metrology results of said semiconductor wafers from said first wafer cup to correlated metrology results of said semiconductor wafers from said second wafer cup; and
performing modification of control parameters in response to the comparison of said metrology results.

8. The method described in claim 7, wherein comparing correlated metrology results of said semiconductor wafers from said first wafer cup to correlated metrology results of said semiconductor wafers from said second wafer cup further comprises comparing at least one critical dimension value from metrology data associated with said first wafer cup with metrology data associated with said second wafer cup.

9. The method described in claim 7, wherein performing modification of control parameters further comprises:
acquiring error data from said comparison of correlated metrology results of said semiconductor wafers from said first wafer cup to correlated metrology results of said semiconductor wafers from said second wafer cup;
determining if said error data is inside a deadband; and
modifying at least one control input parameter based upon a determination that said error data is not inside said deadband.

10. An apparatus, comprising:
a computer system;
a manufacturing model coupled with said computer system, said manufacturing model being capable of generating at least one control parameter input signal;
a machine interface coupled with said manufacturing model, said machine interface being capable of receiving process recipes from said manufacturing model;
a first processing tool capable of processing semiconductor wafers and coupled with said machine interface, said first processing tool being capable of receiving at least one control input parameter signal from said machine interface;
a first wafer cup coupled with said first processing tool for receiving semiconductor wafers, wherein said first wafer cup is capable of applying a photoresist material onto a semiconductor wafer;
a second processing tool capable of processing semiconductor wafers and coupled with said machine interface, said second processing tool being capable of receiving at least one control input parameter signal from said machine interface;
a second wafer cup coupled with said second processing tool for receiving semiconductor wafers, wherein said second wafer cup is capable of applying a photoresist material onto a semiconductor wafer;
a metrology tool coupled with said first processing tool and said second processing tool, said metrology tool being capable of acquiring metrology data;
a metrology data processing unit coupled with said metrology tool and said computer system, said metrology data processing unit being capable of organizing said acquired metrology data and sending said organized metrology data to said computer system; and
a controller operatively coupled with said computer system, said controller to perform a multi-wafer-cup process analysis, said multi-wafer-cup process analysis comprising correlating identification data relating to said semiconductor devices from said first and second cups with metrology data relating to semiconductor devices from said first and second cups.

11. The apparatus described in claim 10, wherein said computer system is integrated into an automatic process control system.

12. The apparatus described in claim 10, wherein said manufacturing model is integrated within said computer system.

13. The apparatus described in claim 10, wherein said first processing tool is capable of performing a photolithography process.

14. The apparatus described in claim 10, wherein said second processing tool is capable of performing a photolithography process.

15. The apparatus described in claim 10, wherein said first wafer cup and said second wafer cup are capable of simultaneous operation.

16. The apparatus described in claim 10, wherein said metrology tool is capable of acquiring critical dimension data.

17. An apparatus, comprising:
means for performing at least one process run of semiconductor devices;
means for performing a multi-wafer-cup process analysis upon the processed semiconductor devices, said means for performing said multi-wafer-cup process analysis further comprising correlating identification data relating to said semiconductor devices from a plurality of cups, with metrology data relating to semiconductor devices from said plurality of cup; and
means for modifying at least one control parameter for a subsequent process run of semiconductor devices using results from said multi-wafer-cup process analysis.

18. A computer readable program storage device encoded with instructions that, when executed by a computer, performs a method, comprising:

performing at least one process run of semiconductor devices;

performing a multi-wafer-cup process analysis upon the processed semiconductor devices, said multi-wafer-cup process analysis comprising correlating identification data relating to said semiconductor devices from a plurality of cups, with metrology data relating to semiconductor devices from said plurality of cups; and modifying at least one control parameter for a subsequent process run of semiconductor devices using results from said multi-wafer-cup process analysis.

19. The computer readable program storage device encoded with instructions that, when executed by a computer, performs the method described in claim 18, wherein performing a process run of semiconductor devices further comprises processing semiconductor wafers.

20. The computer readable program storage device encoded with instructions that, when executed by a computer, performs the method described in claim 19, wherein processing semiconductor wafers further comprises performing a photolithography process on said semiconductor wafers.

21. The computer readable program storage device encoded with instructions that, when executed by a computer, performs the method described in claim 18, wherein performing a multi-wafer-cup process analysis upon the processed semiconductor devices further comprises:

processing semiconductor wafers in a first wafer cup;

acquiring identification data associated with said semiconductor wafers in said first wafer cup;

acquiring metrology data associated with said processed semiconductor wafers in said first wafer cup;

correlating said acquired metrology data relating to said semiconductor wafers in said first wafer cup with said identification data;

processing semiconductor wafers in a second wafer cup;

acquiring identification data associated with said semiconductor wafers in said second wafer cup;

acquiring metrology data associated with said processed semiconductor wafers in said second wafer cup;

correlating said acquired metrology data relating to said semiconductor wafers in said second wafer cup with said identification data;

comparing said correlated metrology results of semiconductor wafers from said first wafer cup and said second wafer cup to a predetermined standard; and performing modification of control parameters in response to the comparison of said metrology results.

22. The computer readable program storage device encoded with instructions that, when executed by a computer, performs the method described in claim 21, wherein comparing said correlated metrology results of semiconductor wafers from said first wafer cup and said second wafer cup to a predetermined standard further comprises comparing said correlated metrology data to a predetermined critical dimension value.

23. The computer readable program storage device encoded with instructions that, when executed by a computer, performs the method described in claim 21, wherein performing modification of control parameters further comprises:

acquiring error data from said comparison of metrology data to said predetermined standards;

determining if said error data is inside a deadband; and modifying at least one control input parameter based upon a determination that said error data is not inside said deadband.

24. The computer readable program storage device encoded with instructions that, when executed by a computer, performs the method described in claim 18, wherein performing a multi-wafer-cup process analysis upon the processed semiconductor devices further comprises:

processing semiconductor wafers in a first wafer cup;

acquiring identification data associated with said semiconductor wafers in said first wafer cup;

acquiring metrology data associated with said processed semiconductor wafers in said first wafer cup;

correlating said acquired metrology data relating to said semiconductor wafers in said first wafer cup with said identification data;

processing semiconductor wafers in a second wafer cup;

acquiring identification data associated with said semiconductor wafers in said second wafer cup;

acquiring metrology data associated with said processed semiconductor wafers in said second wafer cup;

correlating said acquired metrology data relating to said semiconductor wafers in said second wafer cup with said identification data;

comparing said correlated metrology results of said semiconductor wafers from said first wafer cup to correlated metrology results of said semiconductor wafers from said second wafer cup; and performing modification of control parameters in response to the comparison of said metrology results.

25. The computer readable program storage device encoded with instructions that, when executed by a computer, performs the method described in claim 24, wherein comparing correlated metrology results of said semiconductor wafers from said first wafer cup to correlated metrology results of said semiconductor wafers from said second wafer cup further comprises comparing at least one critical dimension value from metrology data associated with said first wafer cup with metrology data associated with said second wafer cup.

26. The computer readable program storage device encoded with instructions that, when executed by a computer, performs the method described in claim 24, wherein performing modification of control parameters further comprises:

acquiring error data from said comparison of correlated metrology results of said semiconductor wafers from said first wafer cup to correlated metrology results of said semiconductor wafers from said second wafer cup;

determining if said error data is inside a deadband; and modifying at least one control input parameter based upon a determination that said error data is not inside said deadband.

27. An apparatus, comprising:

a controller adapted to perform a multi-wafer-cup process, said multi-wafer-cup process comprising correlating identification data relating to a wafer from a plurality of cups, with metrology data relating to wafers from said plurality of cups.

28. The apparatus of claim 27, further comprising:

a computer system;

a manufacturing model coupled with said computer system, said manufacturing model being capable of generating at least one control parameter input signal;

a machine interface coupled with said manufacturing model, said machine interface being capable of receiving process recipes from said manufacturing model;

a first processing tool capable of processing wafers and coupled with said machine interface, said first processing tool being capable of receiving at least one control input parameter signal from said machine interface;

a first wafer cup coupled with said first processing tool for receiving wafers, wherein said first wafer cup is capable of applying a photoresist material onto a semiconductor wafer;

a second processing tool capable of processing wafers and coupled with said machine interface, said second processing tool being capable of receiving at least one control input parameter signal from said machine interface;

a second wafer cup coupled with said second processing tool for receiving wafers, wherein said second wafer cup is capable of applying a photoresist material onto a semiconductor wafer;

a metrology tool coupled with said first processing tool and said second processing tool, said metrology tool being capable of acquiring metrology data; and a metrology data processing unit coupled with said metrology tool and said computer system, said metrology data processing unit being capable of organizing said acquired metrology data and sending said organized metrology data to said computer system.

* * * * *

UNITED STATES PATENT AND TRADEMARK OFFICE
CERTIFICATE OF CORRECTION

PATENT NO. : 6,549,822 B1
DATED : April 15, 2003
INVENTOR(S) : Anthony J. Toprac It is certified that error appears in the above-identified patent and that said Letters Patent is hereby corrected as shown below:

Column 3,
Line 4, insert -- by -- before "the present invention".

Column 4,
Line 60, delete "mount" and insert therefore -- amount --.

Signed and Sealed this

Second Day of September, 2003

JAMES E. ROGAN
*Director of the United States Patent and Trademark Office*